(12) United States Patent
Glenn et al.

(10) Patent No.: US 6,406,934 B1
(45) Date of Patent: Jun. 18, 2002

(54) WAFER LEVEL PRODUCTION OF CHIP SIZE SEMICONDUCTOR PACKAGES

(75) Inventors: Thomas P. Glenn, Gilbert; Steven Webster, Chandler; Vincent DiCaprio, Mesa, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/654,978

(22) Filed: Sep. 5, 2000

(51) Int. Cl.[7] .............................................. H01L 21/48
(52) U.S. Cl. ...................... 438/106; 438/118; 438/122; 438/123; 438/124; 438/192; 438/460
(58) Field of Search ................................ 438/106, 122, 438/123, 124, 192, 118, 460

(56) References Cited

U.S. PATENT DOCUMENTS

| | | | |
|---|---|---|---|
| 5,229,647 A | 7/1993 | Gnadinger | 257/785 |
| 5,506,756 A | 4/1996 | Haley | 361/789 |
| 5,682,062 A | 10/1997 | Gaul | 257/686 |
| 5,858,815 A | * 1/1999 | Heo et al. | 438/112 |
| 5,863,813 A | * 1/1999 | Dando | 438/114 |
| 5,888,884 A | 3/1999 | Wojnarowski | 438/462 |
| 5,933,711 A | * 8/1999 | Cho | 438/123 |
| 5,977,624 A | * 11/1999 | Heo et al. | 257/701 |
| 6,002,163 A | 12/1999 | Wojnarowski | 257/620 |

* cited by examiner

*Primary Examiner*—Vu A. Le
*Assistant Examiner*—Pho Luu
(74) *Attorney, Agent, or Firm*—Skjerven Morrill MacPherson LLP; James E. Parsons

(57) ABSTRACT

The invention provides a manufacturing process for making chip-size semi-conductor packages ("CSPs") at the wafer-level without the added size, cost, and complexity of substrates in the packages or the need to overmold them with plastic. One embodiment of the method includes the provision of a semiconductor wafer with opposite top and bottom surfaces and a plurality of dies integrally defined therein. Each die has an electronic device formed in a top surface thereof, and one or more electrically conductive vias extending therethrough that electrically connect the electronic device to the bottom surface of the die. The openings for the vias are formed ablatively with a laser and plated through with a conductive material. In a BGA form of the CSP, the vias connects the electronic device to lands on the bottom surface of the die. The lands may each have a bump of a conductive metal, e.g., solder, attached to it that functions as an input-output terminal of the CSP. When fabrication of the wafer is complete, the finished packages are singulated from the wafer using conventional wafer cutting techniques.

20 Claims, 3 Drawing Sheets

WAFER LEVEL PRODUCTION OF CHIP SIZE SEMICONDUCTOR PACKAGES

RELATED APPLICATIONS

This application is related to U.S. application Ser. No. 09/655,439, filed Sep. 5, 2000.

BACKGROUND

1. Technical Field

This invention pertains to semiconductor packaging in general, and in particular, to making chip size semiconductor packages ("CSPs") that require no encapsulation or interconnective substrate.

2. Related Art

The increasing demand for electronic devices that are smaller, lighter, and yet more functional has resulted in a concomitant demand for semiconductor packages that have smaller outlines and mounting footprints, yet which are capable of increased component packaging densities. One response to this demand has been the development of so-called chip-scale, or chip-size, semiconductor packages ("CSPs") having outline and mounting ("O&M") dimensions that are only slightly greater than those of the semiconductor die, or "chip," packaged therein.

FIGS. 1 and 2 are respectively a top plan and a cross-sectional side elevation view of a semiconductor package 110 incorporating a substrate 112 and a semiconductor die 114 having an integrated circuit ("IC") mounted on it in accordance with the prior art. The substrate 112 illustrated comprises a layer 120 of an insulative material, e.g., a polyimide resin film, laminated between top and bottom conductive layers 122, 124 of a metal, e.g., copper or aluminum. The conductive layers 122, 124 are patterned to define wire bonding pads 126 and circuit traces 128 in the top layer 122, and circuit traces 128 and solder ball mounting lands 130 in the bottom layer 124. The terminal pads 126 and circuit traces 128 are connected to the solder ball lands 130 through the substrate 112 by "vias" 132, i.e., plated-through holes. The solder balls 118 mounted on the lands 130 serve as the input/output terminals of the package 110.

The die 114 has input/output wire bonding pads 134 located at the peripheral edges of its respective top, or "active," surface, and is attached to the top surface of the substrate 112 with, e.g., a layer 136 of an adhesive or an adhesive film. The die pads 134 are then wire bonded to the substrate pads 126 with fine, conductive wires 138, typically gold or aluminum. After wire bonding, the substrate 112, the die 114, and the wires 138 are "overmolded" with a dense, monolithic body, or "mold cap" 144 (shown by dotted outline in FIG. 2, omitted for clarity in FIG. 1), of plastic, typically a filled epoxy resin, that encapsulates the packaged parts and protects them from environmental elements, particularly moisture.

It may be seen that the size, cost and complexity of the prior art CSP 110 can be reduced considerably if the substrate 112 and the encapsulating mold cap 114, along with the manufacturing processes associated with them are eliminated.

BRIEF SUMMARY

This invention provides a manufacturing process for making chip-size semiconductor packages ("CSPs") at the wafer level that eliminates the added size, expense, and complexity of an interconnective substrate, such as a laminate or a lead frame, as well as the need to encapsulate the package in a plastic body.

One embodiment of the method includes the provision of a semiconductor wafer having a plurality of semiconductor dies formed integrally therein. Each die has opposite top and bottom surfaces and an electronic integrated circuit ("IC") device formed in the top surface thereof. One or more conventional device input-output terminal pads are located on the top surface of each die and are electrically connected internally to the electronic device therein.

A via having interior walls is formed through the dies and each terminal pad thereon. In one advantageous embodiment, the vias are ablatively formed through the dies and terminal pads with a laser, and at a temperature high enough to form an insulative coating on the interior walls of the vias simultaneously with the formation of the vias.

Metallizations are formed in the vias and on the bottom surfaces of the dies that redistribute the input-output signals of the IC devices from the terminal pads on the top surfaces of the respective dies, through the vias, and to an array of input-output pads, or lands, on the bottom surface of the respective dies. An optional protective coating may be formed on one or both of the upper and lower surfaces of the wafer to protect against, e.g., moisture.

When processing of the wafer is complete, the resulting "packaged" dies are separated, from the wafer, e.g., by sawing, and are ready for immediate attachment to an associated PCB without requiring an interconnective substrate or overmolding. However, if desired, the dies may be soldered to a substrate and encapsulated along the lines of the prior art package shown in FIGS. 2 and 3.

A better understanding of the above and other features and advantages of the present invention may be had from a consideration of the detailed description below of some exemplary embodiments thereof, particularly if such consideration is made in conjunction with the appended drawings.

DETAILED DESCRIPTION

Figure 3:
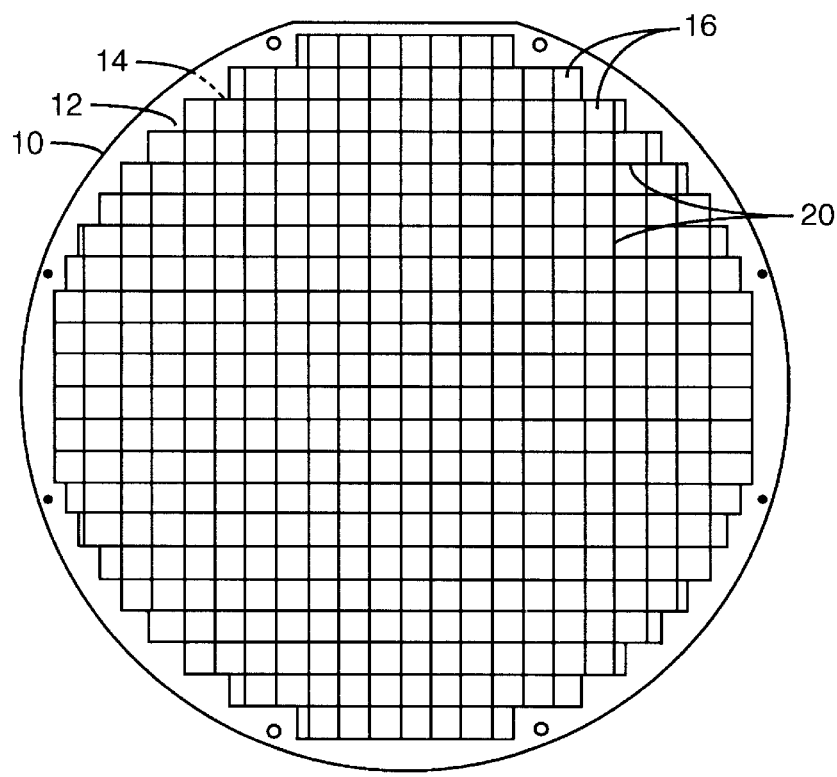
FIG. 3 is top plan view of a conventional semiconductor wafer.

FIG. 3 shows a conventional semiconductor wafer 10 of the type typically employed in the semiconductor industry.

Such wafers 10 are round, have opposite top and bottom surfaces 12 and 14, respectively, a diameter of from about 6 to 12 inches, a thickness of from about 10 to 35 mils (0.254 mm to 0.890 mm), where 1 mil=0.001 inch, or 0.025 millimeter, and may comprise, e.g., crystalline silicon, gallium arsenide, selenium, or germanium.

The wafer 10 may have from less than a dozen to more than several hundred integrated circuit ("IC") chips, or dies 16, integrally formed therein. The dies 16 are segregated from each other on the wafer 10 by mutually orthogonal "streets" 20, e.g., lines marked on or scribed in the top surface 12 of the wafer, and along which the wafer is cut to "singulate," i.e., separate, the individual dies 16 from it.

Figure 1:
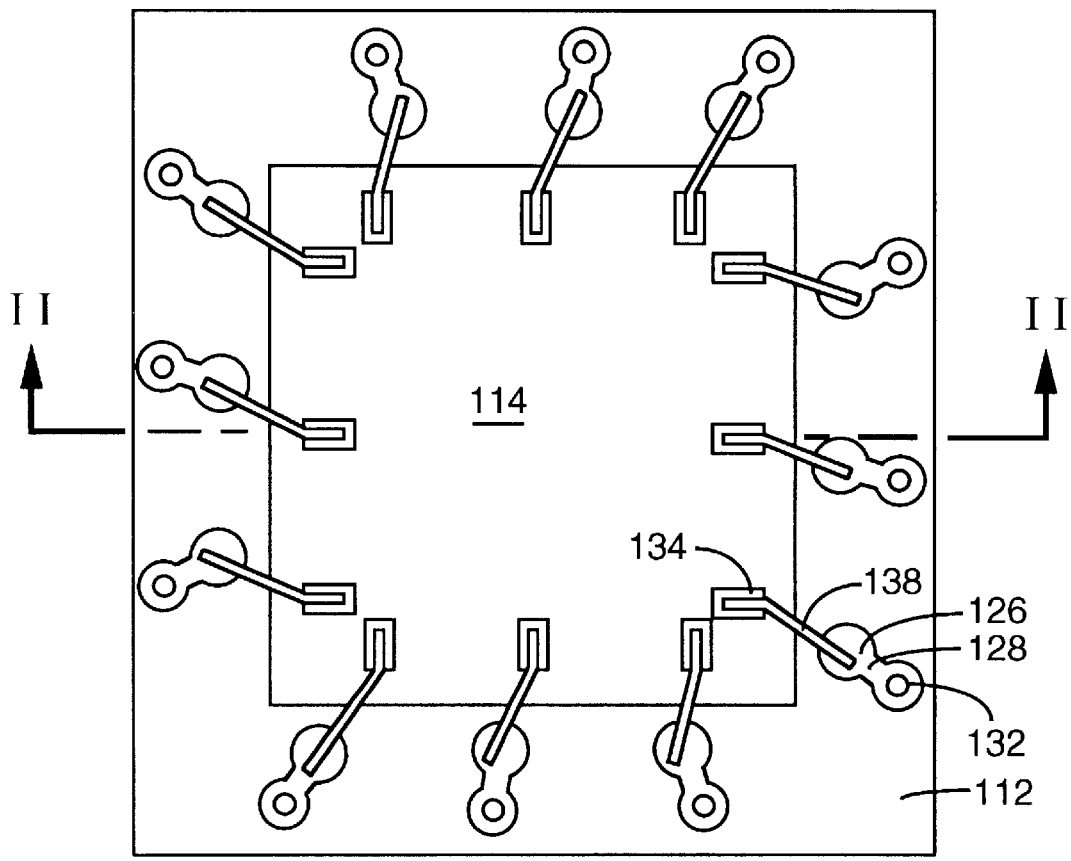
FIG. 1 is a top plan view of a conventional chip size semiconductor package containing a semiconductor die mounted on a substrate in accordance with the prior art.
Figure 2:
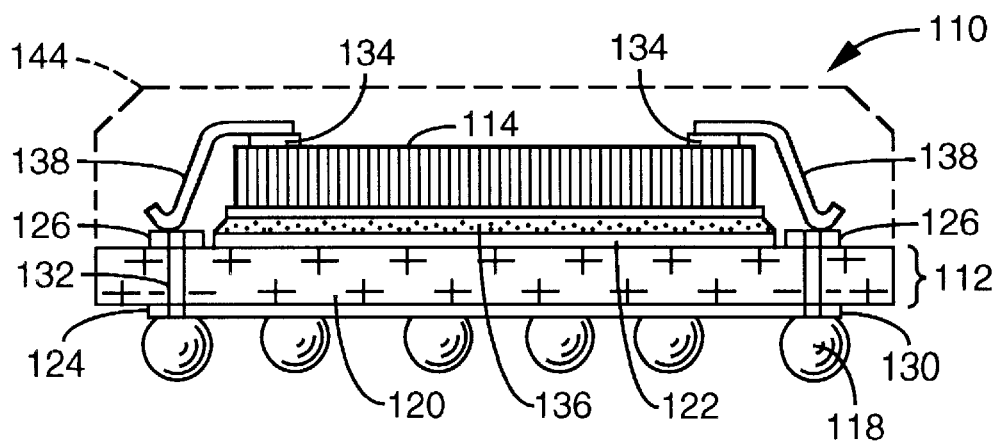
FIG. 2 is a cross-sectional elevation view into the conventional CSP of FIG. 1, as revealed by a section taken therein along the lines II—II.

Each die 16 in the wafer 10 includes an identical electronic IC device 18 (shown by phantom outline in FIGS. 4 and 5) formed in the top surface 12 thereof using conventional semiconductor fabrication techniques. Each die 16 has a plurality of conventional input-output terminal pads 22 on its top surface 14 that are connected by conductive paths 24 located below the top surface of the die to the electronic device 18 therein. In some dies 16, such as that shown in FIG. 4 and those in the prior art package 110 shown in FIG. 1, the terminal pads 22 are located around the periphery of the top surface 12 of the die and outboard of the electronic device 18 therein.

In other embodiments (not illustrated) to which the present invention has advantageous application, the electronic devices 18 may comprise memory devices, e.g., static or dynamic random access memory ("RAM") devices, and may occupy the peripheral portion of the die. The terminal pads 22, on the other hand, may be formed in a central portion of the die 16 inside of the device. The only limitation in the application of the present invention to either of the two configurations of dies 16 discussed above is that the electronic device 18 must not be located below any of the terminal pads 22 on the die, for reasons that will become clear from the following description.

Figure 4:
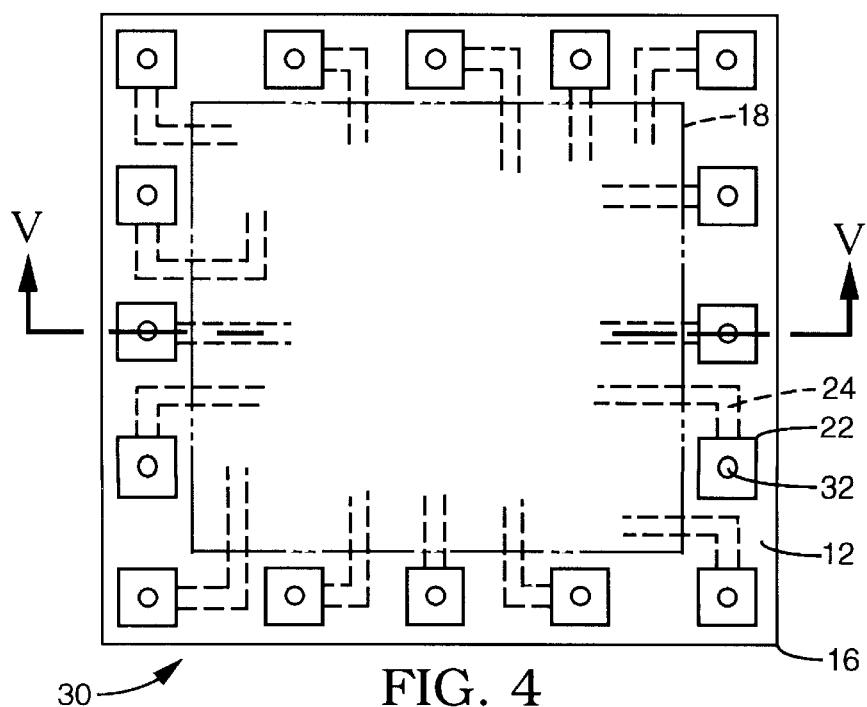
FIG. 4 is a top plan view of a CSP in accordance with one exemplary embodiment of the present invention.
Figure 5:
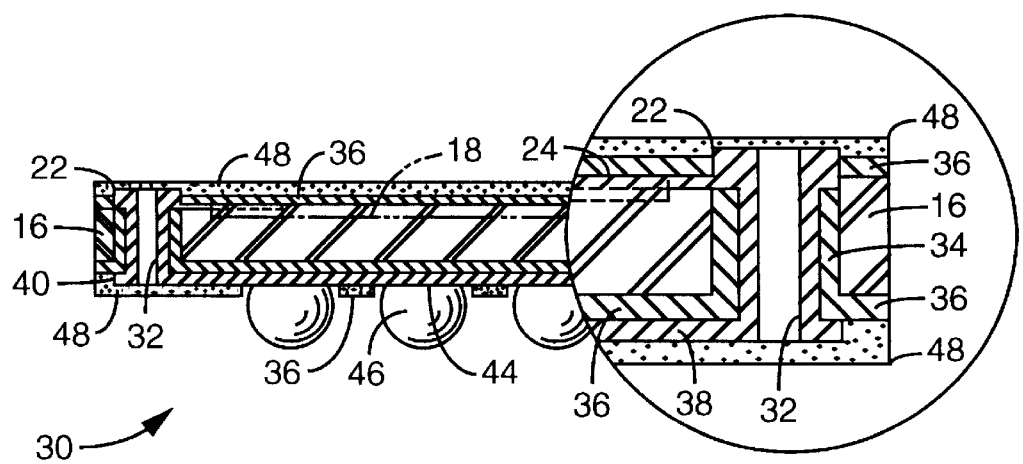
FIG. 5 is a cross-sectional elevation view into the novel CSP of FIG. 4, as revealed by a section taken therein along the lines V—V, and in which the right side of the CSP is shown in an enlarged detail; and, FIG. 6 is a bottom plan view of the novel CSP illustrated in FIGS. 4 and 5.
Figure 6:
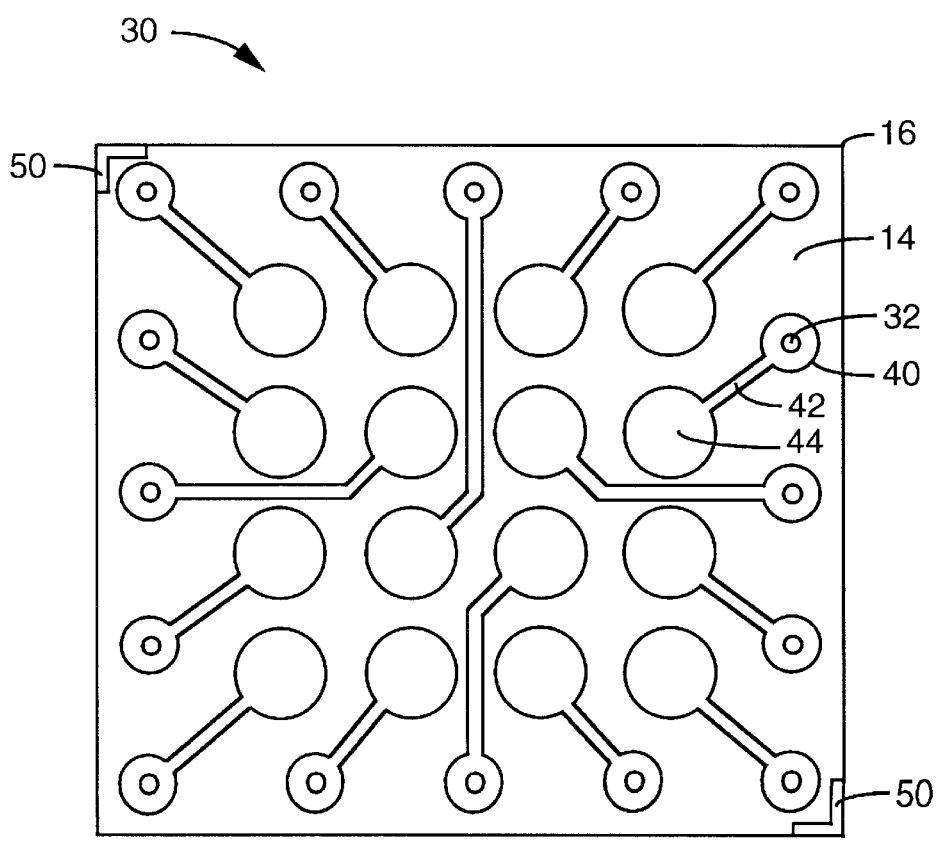

The method of the present invention begins with the provision of a semiconductor wafer 10, such as the one described above and illustrated in FIG. 3. FIG. 4 is a top plan view of a single die 16 taken from the wafer 10 and used in the CSP 30 of the invention. A cross-sectional view of the die 16 taken along the lines V—V in FIG. 4 is shown in FIG. 5, in which the right side of the die is shown in an enlarged detail view for clarity, and a bottom plan view of the die is shown in FIG. 6.

The method of the present invention includes forming vias 32 through each of the dies 16 in the wafer 10. In particular, the vias 32 are formed to extend completely through the dies 16 and a corresponding one of each terminal pad 22 thereon, as shown in FIGS. 4–6. Each via 32 has interior walls with an insulative, or dielectric, coating 34 formed thereon.

The vias 32 are ablatively formed by burning openings through the dies 16 and terminal pads 22 with a laser. In one advantageous embodiment, the vias 32 are burned through the dies 16 and pads 22 with a programmable $CO_2$ laser, which burns the vias at a temperature that is high enough to simultaneously form the insulative coating 34, viz., an oxide of the semiconductor material, e.g., $SiO_2$, on the interior walls of the via during its formation. The dielectric layer 34 on the interior walls of the vias 32 is necessary to prevent an electrically conductive material ex- tending through the vias from shorting to the semiconductor material of the dies 16. By ablating the openings through the wafer 10 at a temperature that is high enough to simultaneously form an oxide coating 34 on the internal walls of the vias 32, the additional processing step of forming the insulative coating on the walls of the vias is eliminated.

However, it should be understood that the vias 32 can also be burned through the dies 16 and pads 22 with a laser, such as an excimer laser, that burns at a cooler temperature, i.e., one that is not hot enough to reliably form an oxide layer 34 on the interior walls of the vias of sufficient thickness. In such an embodiment, the dielectric layer 34 can be formed on the interior walls of the vias 32 after the openings for the vias have been formed by autoclaving the wafer 10 in an atmosphere of steam at a temperature of from about 800–900° C. until the desired thickness of oxide on the interior walls of the vias has been obtained.

The laser-formed vias 32 may be from about 1 to 3 mils in diameter before the conductive material is applied in them. In the embodiment of the CSP 30 illustrated in FIGS. 4–6, the vias 32 are about 3 mils in diameter, and are burned through the pads 22 around the periphery of each die 16 after the electronic device 18 is formed therein to avoid damage to the device when the vias 32 are burned through the wafer 10.

After the openings for the vias 32 have been formed in the wafer 10, the terminal pads 22 on the top surfaces 14 of the respective dies 16 are masked, and an insulative layer 36 of, e.g., silicon dioxide or silicon nitride, is formed over the entire surface of the wafer, excluding the terminal pads, but including the interior walls of the vias 32 if not previously coated with an oxide layer 34 during ablation of the vias, as described above. The insulative layer 36 can be formed by, e.g., autoclaving the wafer 10 in an atmosphere of steam, as described above.

A layer 38 of an electrically conductive material, e.g., a noble metal, such as copper, gold, platinum, nickel, or tantalum, is then formed over the entire bottom surface of the wafer 10, on the interior walls of the vias 32, and on the terminal pads 22 on the top surfaces 12 of the respective dies 16 such that a continuous, electrically conductive path extends between the terminal pads and the conductive layer. The conductive layer 38 can be formed on the wafer 10 by, e.g., electroplating or sputtering the material onto the wafer using known wafer fabrication techniques.

After the conductive layer 36 is formed on the bottom surface 14 of the wafer 10, it is patterned using, e.g., photo-etching techniques, to define pads 40 and circuit traces 42 therein, and in a BGA embodiment, mounting lands 44 for terminal balls 46 on the bottom surface thereof. In particular, the pads 40 are formed concentrically with the vias 32, as shown in FIGS. 5 and 6, and may function as input-output terminals of the CSP 30 by themselves, or in conjunction with a terminal ball or conductive lead attached thereto (not illustrated).

Alternatively, the pads 40 may be connected by circuit traces 42 to respective ones of a rectangular array of lands 44, as illustrated in FIG. 6, in which the terminal balls 46 have been omitted for clarity). Thus, in the particular embodiment illustrated in FIGS. 4–6, each terminal pad 22 of each IC device 18 is electrically connected through a via 32 to a similar pad 40 on the periphery of the bottom surface 14 of the die, which in turn, is connected by a circuit trace 42 on the bottom surface 14 of the respective die 16 to one of the terminal ball mounting lands 44 thereon. Thus, the conductive paths formed in each die 16 function to redistribute the input-output terminals of the device 18 on the top surface 12 of the die into a rectangular array of terminal balls 46 on the bottom surface 14 of the die without the use of a substrate.

Although the insulative layer 36 on the wafer 10 is sufficient to protect the electronic devices 18 on the dies 16 against environmental elements, including moisture, it may be desirable in some applications to apply an additional insulative coating 48 (omitted in FIGS. 4 and 6 for clarity), e.g., a polyimide resin, Paralene, or spun-on glass ("glassivation"), over the top and bottom surfaces 12 and 14 of the wafer, exclusive of openings for the lands 44 and terminal balls 46 thereon, if any, to protect the pads 40 and traces 42 from corrosion.

In one advantageous embodiment of the method of the invention, the individual CSPs 30 are tested and marked, and terminal balls 46 are attached to the lands 44, before the finished CSPs are singulated from the wafer 10. The terminal balls 46 can comprise solder balls, or alternatively, gold cylinders that are plated onto the lands 44, or gold balls that are welded to the lands with conventional ball bonding equipment, then coated with solder. Since it is difficult to accurately saw a wafer 10 having terminal balls 46 mounted on its bottom surface 14 from the top surface 12 thereof, it may be desirable to form "fiducials," i.e., marks or indices 50 (see FIG. 6), on the bottom surface 14 of the wafer to serve as sawing guides, and to then saw the completed CSPs 30 from the wafer from the bottom surface of the wafer, rather than its top surface.

The resulting CSP 30 is truly "chip-sized," and completely eliminates the added cost, size, and complexity of an interconnective substrate in or encapsulation of the package. As an additional advantage, the CSP 30 is mounted to an associated PCB with the active side facing up, which is a requirement in certain optical and micro-mechanical types of devices.

Those of skill in the packaging art will appreciate that the size of the finished CSP 30 of the present invention can vary greatly, depending on the particular type of application at hand. However, for illustrative purposes, an exemplary CSP 30, such as the one illustrated in FIGS. 4–6 may be about 200 mils (5.080 mm) on a side, about 11–26.5 mils (0.279–0.673 mm) thick, exclusive of terminal balls 46, and about 16–31.5 mils (0.406–0.800 mm) thick, inclusive of typically sized terminal balls, where 1 mil=0.001 in.=0.025 mm.

As those of skill in the art will by now appreciate, many modifications, variations, and substitutions are possible in the method and materials of the present invention without departing from its spirit and scope. For example, it may be seen that the invention is easily adapted to semiconductor dies 16 of the type described above that have input-output terminal pads 22 located in the central portion of the upper surface of the die, rather than the peripheral portion, as described above. Accordingly, the scope of the present invention should not be limited by the particular embodiments illustrated and described herein, as these are merely exemplary in nature. Rather, the scope of the present invention should commensurate with that of the claims appended hereafter and their substantial equivalents.

What is claimed is:

1. A method for making a chip size semiconductor package ("CSP"), the method comprising:

providing a semiconductor wafer having opposite top and bottom surfaces and a plurality of dies integrally contained therein, each die having opposite top and bottom surfaces, an electronic IC device in the top surface thereof, and one or more input-output terminal pads on the top surface thereof and in electrical connection with the electronic device therein;

ablating a via having an interior wall through each die and a corresponding one of each terminal pad thereon;

forming a dielectric layer on the interior wall of each via;

forming an electrically conductive path through each via between the corresponding terminal pad and the bottom surface of the respective die; and, cutting the dies from the wafer.

2. The method of claim 1, wherein the vias are ablated through the dies and pads with a laser.

3. The method of claim 2, wherein the laser is a $CO_2$ laser.

4. The method of claim 2, wherein the laser is an excimer laser.

5. The method of claim 1, wherein forming an electrically conductive path comprises:

masking the terminal pads on each die;

forming a dielectric layer on the bottom surface of the wafer;

forming an electrically conductive layer over the dielectric layer on the bottom surface of the wafer; and, patterning the electrically conductive layer to form at least a portion of the conductive paths.

6. The method of claim 5, wherein forming a dielectric layer comprises autoclaving the wafer in an atmosphere of hot steam.

7. The method of claim 5, wherein forming an electrically conductive layer comprises sputtering or plating a metal onto the dielectric layer.

8. The method of claim 1, wherein forming a dielectric layer on the interior wall of each via comprises ablating the vias through the dies and pads at a temperature high enough to simultaneously for an oxide coating on the wall.

9. The method of claim 1, further comprising forming a layer of an insulating material over the top or the bottom surface of the wafer.

10. The method of claim 1, wherein forming an electrically conductive path comprises forming an electrically conductive pad on the bottom surface of the respective die and in electrical connection with the via.

11. The method of claim 1, wherein forming an electrically conductive path comprises forming an electrically conductive circuit trace on the bottom surface of the respective die and in electrical connection with the via.

12. The method of claim 1, wherein forming an electrically conductive path comprises forming a land on the bottom surface of the respective die and in electrical connection with the via.

13. The method of claim 12, further comprising attaching an electrically conductive terminal ball to the land.

14. The method of claim 13, wherein the dies are separated from one another by streets on the top surface of the wafer, and wherein cutting the dies from the wafer comprises:

forming fiducials on the bottom surface of the wafer and in registration with the streets; and, sawing the wafer through from the bottom surface of the wafer in accordance with the fiducials thereon.

15. A method for making a chip size semiconductor package ("CSP"), the method comprising:

providing a semiconductor die having opposite top and bottom surfaces and an integrated circuit ("IC") in the top surface thereof; and, forming means in the die for electrically connecting the IC through the die and to the bottom surface thereof.

16. The method of claim 15, wherein forming the electrically connecting means in the die comprises forming a via through the die; and, forming an electrically conductive path through the via and between the IC and the bottom surface of the die.

17. The method of claim 16, wherein forming a via through the die comprises burning the via through the die with a laser.

18. The method of claim 16, wherein forming an electrically conductive path through the via comprises coating an interior wall of the via with an electrical insulator.

19. The method of claim 16, wherein forming an electrically conductive path through the via comprises coating an interior wall of the via with an electrical conductor.

20. The method of claim 15, wherein the die comprises one of a plurality of identical dies integrally contained in a semiconductor wafer, and further comprising singulating the die from the wafer.

* * * * *

UNITED STATES PATENT AND TRADEMARK OFFICE
CERTIFICATE OF CORRECTION

PATENT NO. : 6,406,934 B1  Page 1 of 1
DATED : June 18, 2002
INVENTOR(S) : Thomas P. Glenn et al.

It is certified that error appears in the above-identified patent and that said Letters Patent is hereby corrected as shown below:

<u>Title page,</u>
Item [57], ABSTRACT,
Line 2, delete "semi-conductor" and insert -- semiconductor --.

<u>Column 4,</u>
Line 3, delete "ex-tending" and insert -- extending --; and

Signed and Sealed this

First Day of April, 2003

JAMES E. ROGAN
*Director of the United States Patent and Trademark Office*